(12) United States Patent
Shimizu et al.

(10) Patent No.: US 8,829,536 B2
(45) Date of Patent: Sep. 9, 2014

(54) SIC SEMICONDUCTOR DEVICE AND MANUFACTURING METHOD THEREOF

(71) Applicant: Natl. Inst. of Advanced Indust. Science and Tech, Chiyoda-ku (JP)

(72) Inventors: Tatsuo Shimizu, Tsukuba (JP); Tetsuo Hatakeyama, Tsukuba (JP)

(73) Assignee: National Institute of Advanced Industrial Science and Technology, Chiyoda-ku (JP)

( * ) Notice: Subject to any disclaimer, the term of this patent is extended or adjusted under 35 U.S.C. 154(b) by 0 days.

(21) Appl. No.: 13/795,316

(22) Filed: Mar. 12, 2013

(65) Prior Publication Data
US 2013/0240906 A1    Sep. 19, 2013

(30) Foreign Application Priority Data

Mar. 16, 2012  (JP) ................................ 2012-060362

(51) Int. Cl.
*H01L 29/78*    (2006.01)
*H01L 21/04*    (2006.01)

(52) U.S. Cl.
USPC ................ 257/77; 257/E29.262; 257/E1.066; 438/268; 438/285

(58) Field of Classification Search
USPC ............. 257/77, E29.262, E21.066; 438/268, 438/285
See application file for complete search history.

(56) References Cited

U.S. PATENT DOCUMENTS 8,138,504 B2 *    3/2012    Harada et al. ................... 257/77

FOREIGN PATENT DOCUMENTS

JP    2009-212365    9/2009

OTHER PUBLICATIONS

W. F. Knippenberg, Growth Phenomena in Silicon Carbide*), Philips Research Reports, vol. 18, No. 3, Jun. 1963, 2 pages.
U.S. Appl. No. 13/784,064, filed Mar. 4, 2013, Shimizu, et al.

* cited by examiner

*Primary Examiner* — Daniel Shook
(74) *Attorney, Agent, or Firm* — Oblon, Spivak, McClelland, Maier & Neustadt, L.L.P.

(57) ABSTRACT

According to one embodiment, an SiC semiconductor device including a p-type 4H—SiC region formed on at least part of a surface portion of an SiC substrate, a first gate insulating film formed on the 4H—SiC region and formed of a 3C—SiC thin film having p-type dopant introduced therein, a second gate insulating film formed on the first gate insulating film, and a gate electrode formed on the second gate insulating film.

16 Claims, 7 Drawing Sheets

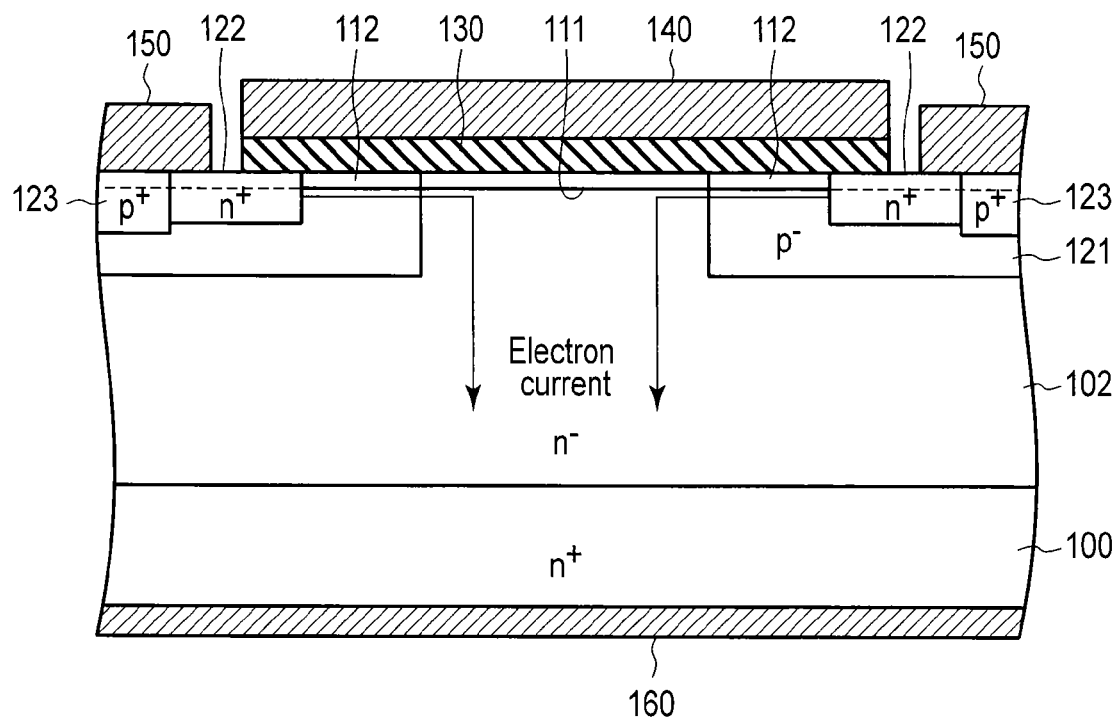
F I G. 3

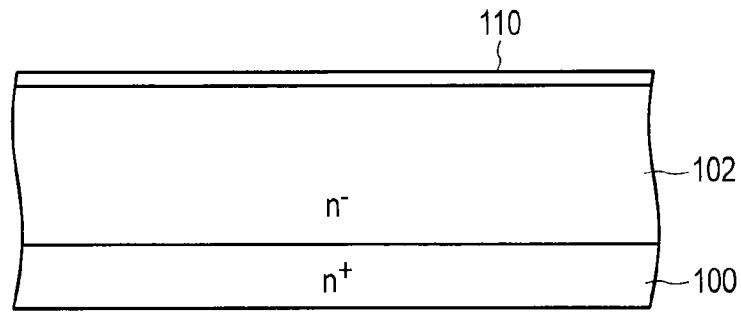
F I G. 5A
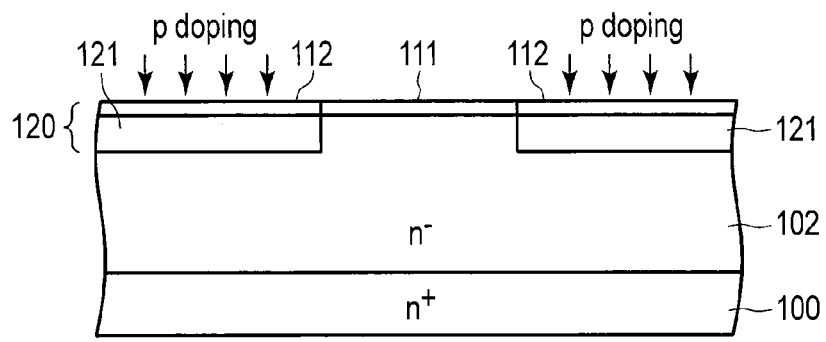
F I G. 5B
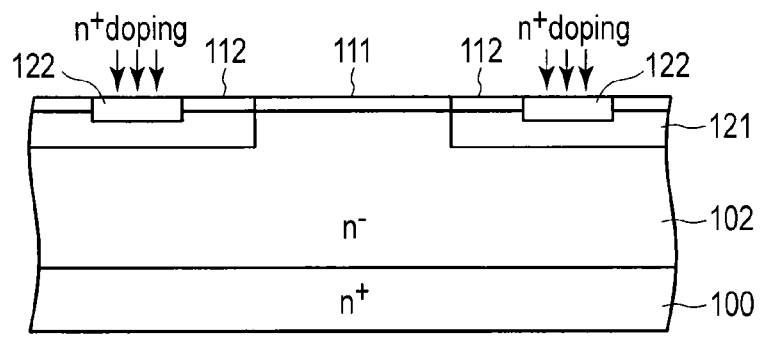
F I G. 5C
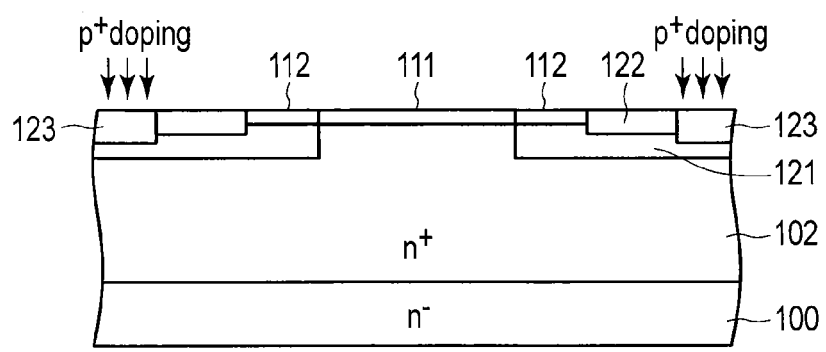
F I G. 5D

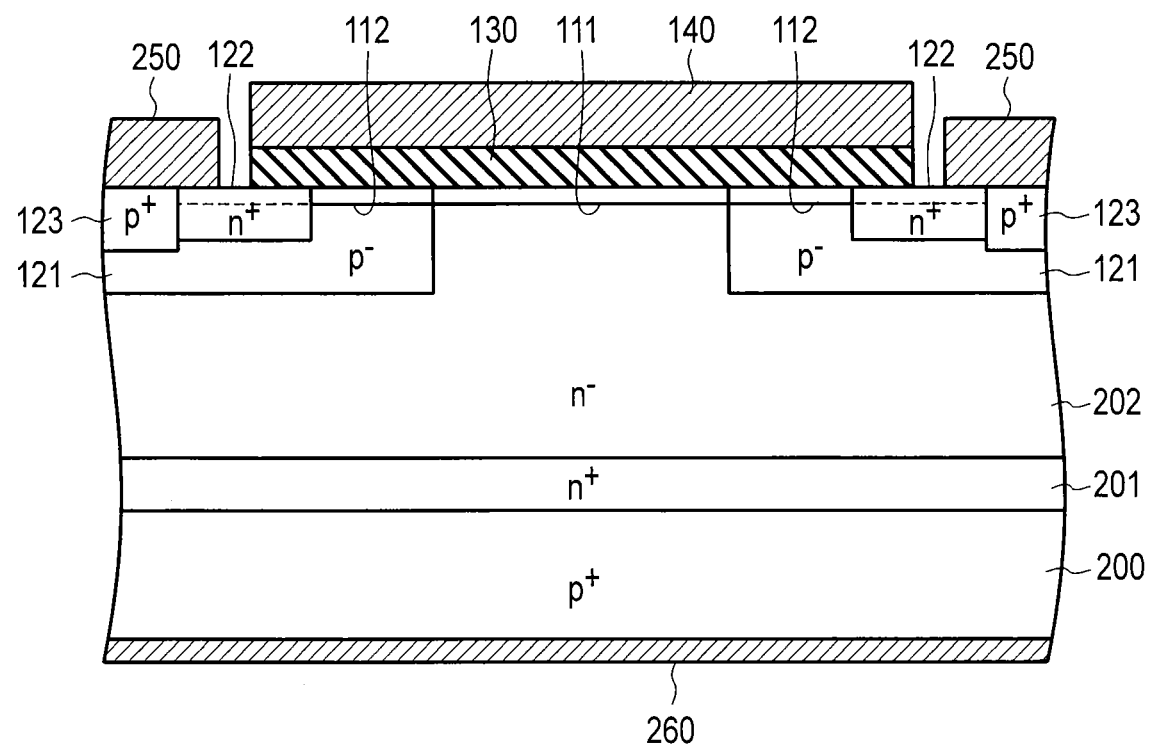
F I G. 6

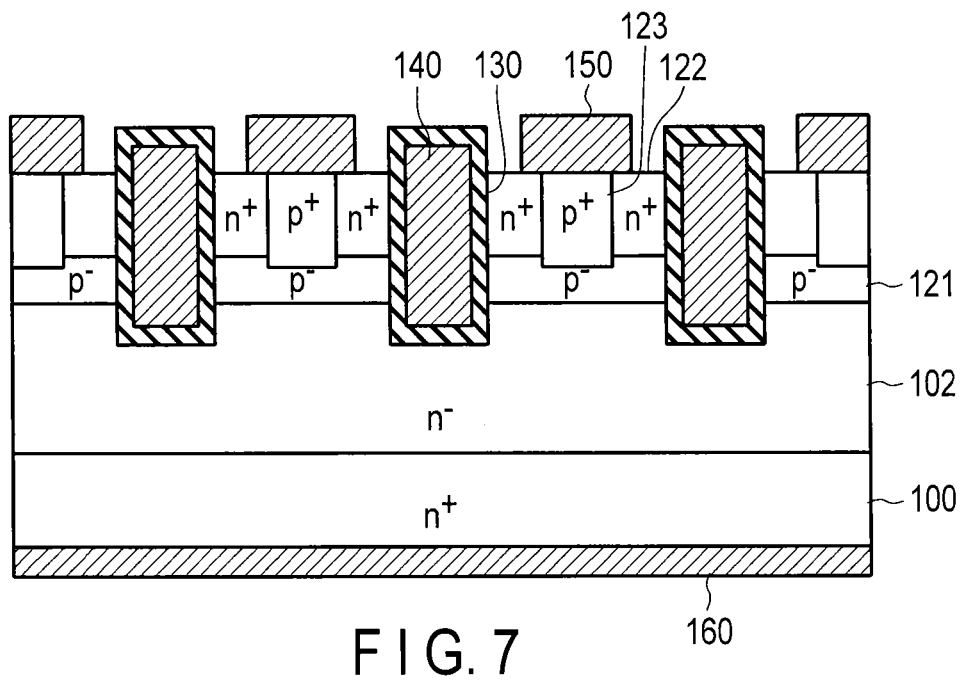
F I G. 7
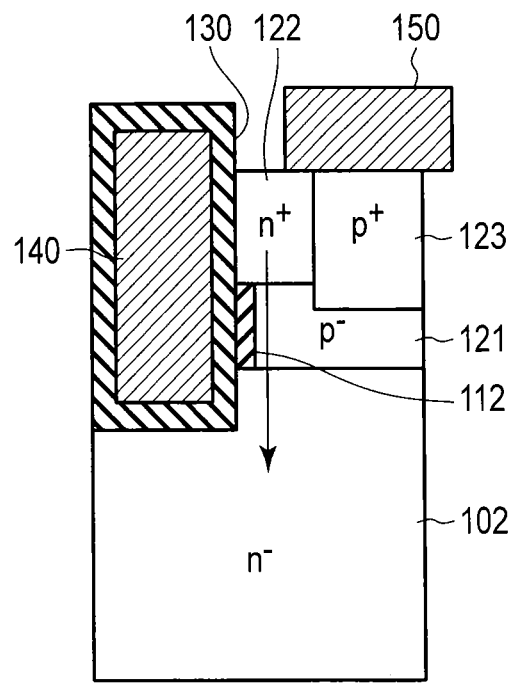
F I G. 8

SIC SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2012-060362, filed Mar. 16, 2012, the entire contents of which are incorporated herein by reference.

FIELD

Embodiments described herein relate generally to an SiC semiconductor device having a MOS structure formed by use of an SiC compound semiconductor and a manufacturing method thereof.

BACKGROUND

Conventionally, when forming an SiC substrate/$SiO_2$ insulating film interface of a MOSFET using SiC, an $SiO_2$ insulating film is formed by subjecting the surface of the SiC substrate to hydrogen termination and then oxidizing the surface or forming an insulating film by deposition. At this time, the hydrogen termination of the SiC substrate surface is easily removed and oxygen enters the inside portion of the substrate and oxidization proceeds.

In a MOSFET using an SiC substrate (4H—SiC) of a 4H structure, the mobility of the SiC substrate/$SiO_2$ insulating film interface becomes extremely low. Even if thoughtful devising is made for the insulating film and interface, only the mobility (less than 100 $cm^2/Vs$) that is far apart from the characteristic (1000 $cm^2/Vs$) that 4H—SiC originally has is obtained.

On the other hand, in a MOSFET using an SiC (3H—SiC) substrate of a 3C structure, the mobility of the SiC substrate/$SiO_2$ insulating film interface becomes sufficiently high. However, in the 3C structure, the device has a strong tendency to become normally on and is difficult to be used. Additionally, the withstand voltage of the 3C structure is 1.5 MV/cm and is insufficient in comparison with the withstand voltage (2.8 MV/cm) of the 4H structure.

BRIEF DESCRIPTION OF THE DRAWINGS

FIG. 3 is a cross-sectional view showing the element structure of a DiMOSFET according to a first embodiment.

FIGS. 5A to 5G are cross-sectional views for illustrating the manufacturing steps of the DiMOSFET according to the first embodiment.

FIG. 6 is a cross-sectional view showing the element structure of an IGBT according to a second embodiment.

FIG. 7 is a cross-sectional view showing the element structure of a trench type vertical MOSFET according to a modification.

FIG. 8 is a cross-sectional view showing the enlarged main configuration of FIG. 7.

DETAILED DESCRIPTION

In general, according to one embodiment, an SiC semiconductor device comprises a p-type 4H—SiC region formed on at least part of a surface portion of an SiC substrate, a first gate insulating film formed on the 4H—SiC region and formed of a 3C—SiC thin film having p-type dopant introduced therein, a second gate insulating film formed on the first gate insulating film, and a gate electrode formed on the second gate insulating film.

First, the basic idea for solving the problem is explained before explaining the embodiments of this invention.

[Necessity of Explication of Mechanism]

It is known that a large number of interface states are present on a 4H—SiC substrate/$SiO_2$ gate insulating film interface and that these lower mobility. However, why these states exist is unclear.

Conventionally, it is considered that the above problem is caused by the presence of carbon clusters or the like created on the $SiO_2$ gate insulating film side of the SiC/$SiO_2$ insulating film interface. By thus considering, it becomes difficult to understand why "the normally on state occurs in the MOSFET using the 3C—SiC substrate". Further, it is impossible to understand the present state in which "a MOSFET using a 4H—SiC substrate with sufficiently high mobility cannot be formed even if an insulating film formation process is variously thoughtfully devised to prevent the C cluster from being formed on the interface as far as possible". Therefore, it is necessary to understand the reason why the interface mobility is low and propose a method of improvement based on the above reason.

[Consideration of Electronic State of C Defects in SiC Substrate]

Figure 1A:
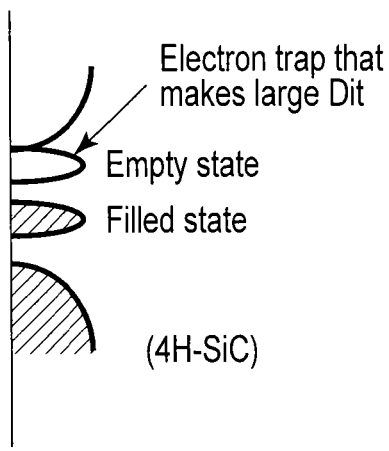
FIGS. 1A, 1B are schematic diagrams for illustrating the electronic state of C defects in an SiC substrate.
Figure 1B:
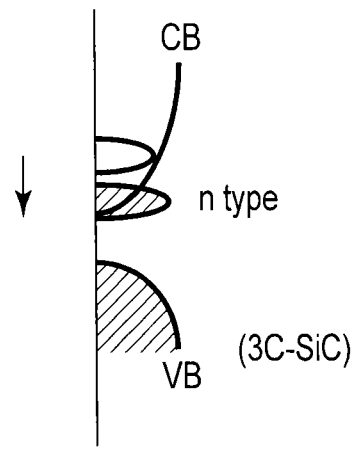

The electronic states of C defects in 4H—SiC and 3C—SiC are derived by means of a first principle calculation. In this case, the first principle calculation is based on density functional theory by means of local density approximation. A norm-conserving pseudopotential is used for Si and an ultrasoft pseudopotential developed by Vanderbilt et al., is used for a material such as C other than Si. FIGS. 1A and 1B are diagrams for illustrating the state densities of C defects in 4H—SiC and 3C—SiC, respectively.

If C defects occur in the substrate, four Si atoms lying around the C defect each have one dangling bond. The dangling bond of Si has a state near the intermediate portion of a band gap of SiC. Therefore, if the dangling bonds of the four Si atoms lying around the C defect interact, the dangling bonds are divided into two groups of two "filled states" and two "empty states" giving four states in total. Then, two states (one filled state and one empty state) among the above states appear in the gap of 4H—SiC. In this case, the energy positions of the conduction band and valence band vary depending on the structure of SiC. Therefore, the positional relationship of the "filled state" and "empty state" in the gap caused by interaction of the dangling bonds of Si depends on the structure of SiC.

As shown in FIG. 1A, an "empty state" occurs directly under the conduction band in the 4H structure. This state lowers the mobility since electrons are trapped. On the other hand, as shown in FIG. 1B, in the 3C structure, it is proved for the first time based on the present calculation that the "filled state" and the conduction band are related to each other and the 3C—SiC substrate itself is converted into an n type if C defects are introduced therein. As a result, a mechanism that sets a normally on state if a MOSFET with a 3C—SiC substrate is formed can be explicated for the first time. That is, the reason why the normally on state tends to occur in the 3C structure is that the channel portion of an n-channel MOSFET is converted into an n type.

[Defect Production Mechanism near Substrate Surface]

First, defect production energy in the SiC substrate is derived by means of the first principle calculation. Energy required for C defect production is 4.0 eV and energy required for Si defect production is 7.5 eV. Based on this, it is understood that C defects tend to most often occur in an SiC substrate.

Next, defect production energy in the SiC substrate surface is derived by means of the first principle calculation. Energy required for C defect production on the most surface of a C plane of the SiC substrate is 0.75 eV and energy required for Si defect production on the most surface of an Si plane of the SiC substrate is 4.6 eV. Since elements on the most surface of the SiC substrate subjected to hydrogen termination have dangling bonds, they are set in a high-energy state. Therefore, it is understood that defects easily occur in comparison with a case of a bulk.

In a portion near the SiC/SiO$_2$ insulating film interface, inner elements (C and Si) are diffused while being exchanged for defects that occurred in the surface. Thus, it is known that a large number of defects occur in the SiC substrate near the SiC/SiO$_2$ insulating film interface.

As described above, C defects influence the mobility in a MOSFET using a 4H—SiC substrate. Thus, the reason why "a 4H-structure MOSFET with sufficiently high mobility cannot be formed even if an insulating film formation process is thoughtfully devised" can be understood. In a MOSFET using a 3C—SiC substrate, a phenomenon wherein the channel becomes n type occurs. Thus, the reason why "the MOSFET using a 3C—SiC substrate is set into a normally on state" is also made clear.

In the embodiment, a vertical double-implanted metal oxide semiconductor field-effect transistor (DiMOSFET) is provided, this having preferable characteristics that include "characteristic (high mobility) of a MOS interface of 3C—SiC that is made clear this time" and "high withstand voltage of 4H—SiC" is provided. For this purpose, a p-type 3C—SiC extremely thin film is formed (for example, by epitaxial growth) on the surface of the vertical DiMOSFET using the normal 4H—SiC substrate and the 3C—SiC extremely thin film is fully compensated for. As a result, the device is featured in that the distance between the gate insulating film SiO$_2$ and the channel is set sufficiently long, that is, a "buried channel type" is formed.

To realize the above semiconductor device, the film thickness and concentration of the p-type 3C—SiC extremely thin film are set in an adequate range. That is, the device features, inserted into the channel portion, a p-type 3C—SiC extremely thin film in which "C defects that cause an n type" and "p-type dopant" are fully compensated for each other is inserted into the channel portion. The feature of the p-type 3C—SiC extremely thin film is explained in the following description.

[Formation Method of Surface p-type 3C—SiC Thin Film]

By the conventional epitaxial growth (that is referred to as an "epi-process"), p-doped 3C—SiC can be epitaxially grown on the surface. In addition, p-doped 3C—SiC can also be formed on the surface by strongly implanting (that is referred to as an "impla-process") p-type dopant in the surface of 4H—SiC to form the surface portion in an amorphous form and heating the same. Further, since the thus formed film functions as a gate insulating film, the film is not necessarily crystallized. By omitting the heating step or suppressing the same to minimum, the portion may be kept in an amorphous state or polycrystalline state. This is advantageous in cost and the characteristic thereof as the insulating film is equivalent to that of the film that is crystallized. The process for forming the channel by means of the impla-process conventionally performed has a feature that the amount of dopant is kept small, the implantation is performed at low energy in order not to damage the crystal as far as possible, and the channel is prevented from being formed in an amorphous form. It is greatly different in that the channel is formed in an amorphous form once. Thus, formation of 3C—SiC can be attained by either one of the methods of the epi-process and impla-process.

Since the impla-process can be easily introduced into the normal MOS formation process, it is extremely effective in cost and time. In the conventional configuration, it is understood that C defects become a problem, but in the present configuration, no problem occurs even if C defects occur. If C defects occur, it is featured in that the configuration in which a high-performance MOS structure can be formed by positively utilizing the C defects is obtained by cleverly using occurrence of the C defects.

[Feature of Preset Buried Channel]

Unlike a normal buried channel, the present channel has a significant feature that a counter-doping process is not performed. In the counter-doping process, a problem of "the mobility is not so raised as expected in the MOS structure of SiC" occurs. It is understood that the main cause of the above problem is that C defects are increased in the doping process to increase C defects in the channel portion. Conventionally, since care is not taken with regard to C defects, there is a problem that the mobility is not raised as much as expected. In this embodiment, the counter-doping process is not necessary. In this case, if SiO$_2$ is formed on 3C—SiC, C defects occur on the interface and, as a result, the channel is converted to an n type. Thus, the p-type 3C—SiC extremely thin film is fully compensated for in a self-matching fashion to permit the 3C—SiC thin film to be regarded as a portion of the gate insulating film. That is, it becomes unnecessary to take care for C defects and C defects are positively utilized.

[P-type Dopant Concentration of 3C—SiC Thin Film]

If the p-type dopant concentration is high to some extent and the film thickness of the 3C—SiC thin film is set to a certain small value, the number of C defects varies according to the "p-type dopant concentration" and "film thickness of the 3C—SiC thin film". That is, C defects can be produced to automatically compensate for p-type dopant and, as a result, the thin film can be fully compensated for in a self-matching fashion. If the p-type dopant concentration is $10^{17}/cm^3$ or more (that is the minimum value that causes p-type dopant in 3C—SiC to sufficiently interact with one another) and $10^{21}/cm^3$ or less (that is the maximum value of p-type dopant normally used), C defects are produced in the surface portion and diffused to re-distribute the C defects to compensate for the entire film when the film thickness is small. Since C defects can be stabilized by giving electrons to the p-type dopant, C defects are distributed according to the p concentration. As a result, the entire film can be set to the most stable state.

Conventionally, the electron traps of the order of $10^{18}/cm^3$ are observed near the 4H—SiC/SiO$_2$ interface. Therefore, if a larger amount of p dopant is not introduced, the C defects in a portion near the interface become excessive and the entire 3C thin film becomes n type. From the above description, the p dopant concentration is set to $10^{18}/cm^3$ or more and $10^{21}/cm^3$ or less. When taking the efficiency of formation of the semiconductor device into consideration, it is desirable to set the concentration to a slightly larger value in order not to influence the formation process of an SiO$_2$ film. If the p-type dopant concentration is excessively low, there is a risk that the n type appears (high-concentration n+) when excessive C defects are produced.

When it is considered that compensation is made by diffusion, it is preferable to set the p-type dopant concentration to a slightly smaller value. If the p-type dopant concentration is high, it cannot easily be filled by the use of C defects. Therefore, it is considered more preferable that the upper limit and the lower limit are suppressed by approximately one digit and are set to $10^{19}/cm^3$ or more and $10^{20}/cm^3$ or less. In this embodiment, as the amount of p-type dopant in the p-type 3C—SiC extremely thin film, a basic target value of approximately $4 \times 10^{19}/cm^3$ is used.

[Feature of Buried Channel Structure in Present Embodiment]

In the conventional buried channel, a problem that the channel controllability is lowered occurs. As a result, there is a problem that the peak of the mobility extends into a portion on the low-voltage side and a sufficiently large current cannot be obtained for an actual operating voltage. Further, there is a problem that a normally on state occurs if the device is operated at high temperatures since the threshold voltage is lowered. However, in this embodiment, the channel controllability is sufficiently enhanced by functioning 3C—SiC that is fully compensated to become an insulating film as a gate insulating film and suppressing the film thickness of an $SiO_2$ film formed on 3C—SiC to a minimum necessary value.

In this case, the important point that is made clear in the process of development is that the dielectric constant becomes larger than that of the conventional 3C—SiC when a p type is compensated for by introducing C defects into the 3C structure. Therefore, an induced charge can be increased. Further, the wave function of electrons extends into the insulating film side, and therefore, the control performance can be further enhanced. As a result, the channel controllability can be strengthened. That is, the same effect as that obtained when a gate insulating film formed of a high-dielectric-constant insulating film is used can be obtained by using "3C—SiC obtained by compensating for p-type dopant by use of C defects" as a gate insulating film. As a result, a sufficiently large current can be obtained with an actual operating voltage. Further, the threshold value can be made sufficiently large.

It is necessary to pay much attention to the fact that the above case is different from a case where an undoped SiC insulating film is used from the beginning. Since sufficient band offset on the conduction band side cannot be provided in the SiC insulating film, it becomes necessary to form the film into a stack film together with an insulating film such as an $SiO_2$ film. As explained above, since C defects are produced in SiC if an $SiO_2$ film is formed on an SiC insulating film, an insulating film with a bad characteristic will be formed.

[Film Thickness]

First, if the lower limit is set to 2 nm or less, C defects cannot be sufficiently absorbed. Therefore, C defects appear on the 4H—SiC substrate side of the lower layer and the mobility is degraded. The most important point is to absorb C defects and it can be said more preferable if the film thickness is set larger only from the above aspect.

Next, if the upper limit is set to 5 nm or more, p-type dopant cannot be fully compensated for since p-type dopant and C defects cannot sufficiently interact with each other. If sufficient interaction cannot be achieved, roughness and fineness appear in the distributions of p-type dopant and C defects thereby degrading the mobility. Therefore, the film thickness must be set smaller than approximately 5 nm to attain sufficient interaction. Further, if the film thickness is made larger than necessary, the 3C—SiC film used as a gate insulating film becomes thick. Since this lowers the capacitance, it is disadvantageous for the film when used as a gate insulating film. That is, it can be said preferable if the film thickness is smaller.

From the above description, it is preferable to set the thickness of the 3C—SiC thin film in a range of 2 to 5 nm. Further, it is more preferable to set the upper limit and lower limit of the thickness in a range of 3 to 4 nm to stably attain the satisfactory characteristic. In this embodiment, the basic target is set to approximately 3.5 nm.

The concentration and thickness have correlation. If the concentration is set high, it is preferable to set the thickness small. This is because it is difficult to compensate for p-type dopant with C defects if the concentration is set high and the thickness is set large. If the concentration is set low, the thickness can be made large. In this case, since sufficient C defects can be produced, the p-type dopant can be easily compensated for by diffusing the C defects even if the thickness is large. That is, in a preferable range of the concentration and film thickness, it is preferable to set the thickness small if the concentration is high and set the thickness large if the concentration is low.

Figure 2:
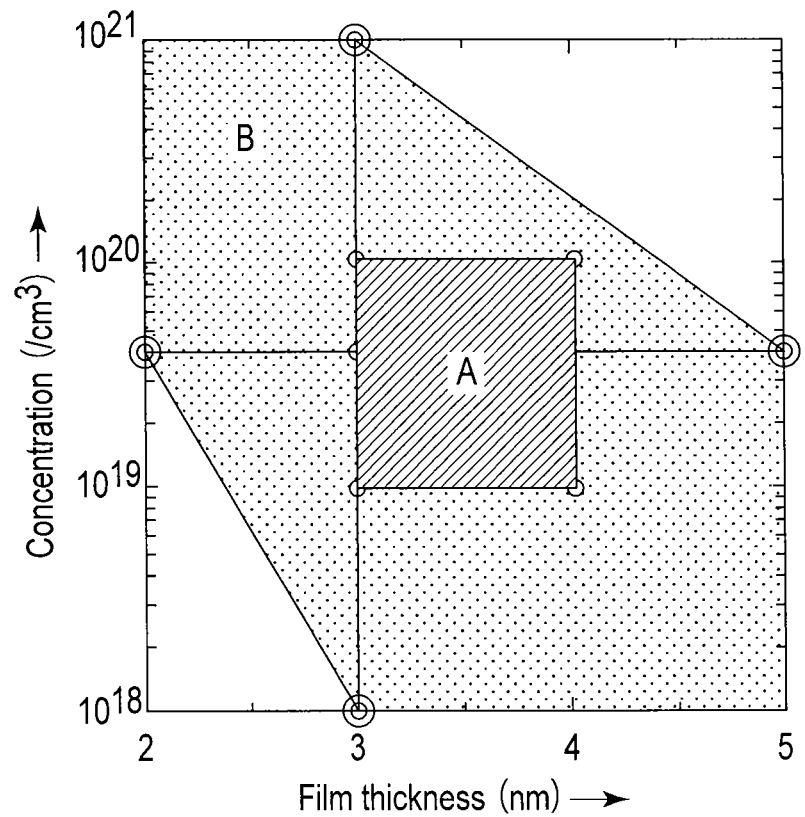
FIG. 2 is a characteristic diagram showing the relationship between the film thickness and the concentration to obtain an insulating film with a preferable characteristic.

The relationship between the film thickness and concentration is shown in FIG. 2 as a rough image. An A region (film thickness of 3 to 4 nm and concentration of $10^{19}$ to $10^{20}/cm^3$) is most preferable. Further, a B region is a region obtained by removing a region of small film thickness and low concentration and a region of large film thickness and high concentration from a region with a film thickness of 2 to 5 nm and the concentration of $10^{18}$ to $10^{21}/cm^3$. The removed regions are not so preferable.

[Termination Structure]

The termination structure of the whole device chip is normally formed by ion implantation. In the present embodiment, the same method can be used since only the 3C thin film is sandwiched. When a strong termination structure is required, a method for burying an $SiO_2$ insulating film by shallow trench isolation (STI) is effective.

[Contact Resistance between 3C—SiC and Metal]

When taking a DiMOSFET, IGBT and the like into consideration, it becomes necessary to set the contact resistance with the metal sufficiently low. In this example, a case where the contact resistance between n-type, p-type 3C—SiC and the metal is lowered is considered.

First, contact with n-type SiC is explained. In the 3C structure, the energy position of the bottom of the conduction band is deeper in comparison with that of the 4H structure and the end of the conduction band is set at 4.47 eV. Based on this, an ohmic contact can be attained without subjecting the structure to the conventional high-temperature process if an electrode (for example, a $Ni_2Si$ electrode or the like) conventionally used as an n-type electrode of 4H—SiC is used.

In the case of contact to conventional 4H—SiC, a metal and SiC substrate react in a complex fashion to make an ohmic contact and, at this time, a temperature of approximately 850° C. to 950° C. is used. On the other hand, in the case of contact with the 3C structure, any temperature can be used if a film can be formed since no particular reaction is required. If it is desired to form silicide such as $Ni_2Si$, it is sufficient to use the formation temperature of 500 to 600° C. In this embodiment, a temperature of 550° C. is used. In this case, since the electron barrier is completely eliminated, the contact resistance (approximately $5 \times 10^{-7}$ $\Omega cm^2$ at 550° C.) that is lower by two digits than the n-type contact resistance (approximately $5 \times 10^{-5}$ $\Omega cm^2$ at 900° C.) conventionally obtained can be obtained by means of a low-temperature process. The low-temperature process has the merit of not only easiness and cost but also the merit of preventing an SiO$_2$/SiC interface from becoming rough and preventing C defects from being excessively formed in SiC. The above merits directly lead to prevention of degradation in the mobility and prevention of formation of spatial distribution of SiC/metal contact. That is, the process for permitting the temperature for contact formation to be lowered has an extremely important meaning.

In the contact with p-type SiC, an ohmic contact can be realized by introducing a large amount of p-type dopant. If the 3C structure is permitted, the 3C structure can be recovered by performing a heating process at a low temperature or a local laser annealing process even if the structure is destroyed by introducing a large amount of dopant. In the contact region, polycrystalline SiC of the p-type 3C structure or amorphous SiC of the 3C structure can be satisfactorily used. On the other hand, in the case of the 4H structure, it is difficult to recover the original structure if the structure is once destroyed. Therefore, when a large amount of dopant is introduced, ion-implantation energy is divided into plural stages and care must be taken not to destroy the crystal structure. That is, for the p-type contact, a large amount of p-type dopant is introduced to easily obtain an ohmic contact in the case of the 3C structure.

An SiC semiconductor device of one embodiment is explained below with reference to the accompanying drawings.

First Embodiment

FIG. 3 is a cross-sectional view showing the element structure of an SiC semiconductor device according to a first embodiment and particularly shows a case where the embodiment is applied to a DiMOSFET.

A low-concentration n-type (n$^-$-type) 4H—SiC layer 102 is formed on the surface of a high-concentration n-type (n$^+$-type) silicon carbide (4H—SiC) substrate 100. In this embodiment, the structure obtained by forming the SiC layer 102 on the SiC substrate 100 is used as an element forming substrate. The n$^-$-type 4H—SiC layer 102 is formed with the impurity concentration lower than that of the n$^+$-type 4H—SiC substrate 100 and used as a withstand voltage holding layer. SiC is formed with various structures (poly type), but in this embodiment, if it is not particularly pointed out, the 4H structure is used as the SiC structure. This is because it is considered that the 4H structure is optimum to form a power device since the 4H structure has the highest withstand voltage and the mobility in the bulk is high.

High-concentration p-type (p$^+$-type) 3C—SiC thin films (first gate insulating films) 111, 112 are formed by epitaxial growth on the surface of the 4H—SiC layer 102. High-concentration p-type dopant in the channel region of the 3C—SiC thin film 112 is compensated for by carbon (C) defects. High-concentration p-type dopant in the 3C—SiC thin film 111 between the channel regions is compensated for by carbon (C) defects. The 3C—SiC thin film 112 functions as a first gate insulating film on the channel region. If 3C—SiC is epitxially grown at low temperatures (a film forming window is present in a temperature range of 1000 to 1300° C.), the other structure is not mixed therein and a high-quality 3C structure thin film of high quality can be formed (see W. F. Knippenberg, Philips Research Reports 18, p 161, 1963).

As another method for forming 3C—SiC on the substrate surface, a method for strongly implanting p-type dopant or the like into the surface portion of the 4H—SiC layer 102 to convert the portion into an amorphous form and re-crystallizing the same by means of a heating process (a temperature of 1000 to 1300° C. is required) is also effective as described before. In FIG. 3, the high-concentration p-type (p$^+$-type) 3C—SiC thin film is formed on the entire surface. The film thickness is small and is set to approximately 3.5 nm, for example. As the dopant, Al is used for a p type and N or P is used for an n type in the later process. The 3C—SiC thin films finally become the 3C—SiC thin films 111, 112 in the later process.

An electrode (second conduction electrode) 160 of a conductive material is formed on the back of the 4H—SiC substrate 100. The electrode 160 is used as a drain electrode. The electrode 160 is formed of Ni and is subjected to an annealing process at 1050° C., for example, to make an ohmic contact with the back of the 4H—SiC substrate 100. In the conventional process, a temperature of 800° C. or more cannot be applied. This is because the SiC substrate/SiO$_2$ interface becomes rough. However, in this embodiment, since the channel is buried in the SiC substrate, no problem occurs even if the above interface (the interface between 3C—SiC and SiO$_2$) becomes rough. Therefore, it becomes possible to perform a high-temperature process of 1050° C. Thus, the process temperature can be set high and this is one of the important effects of this embodiment.

Further, as another method of forming the back electrode, 3C—SiC may be formed on the entire back surface. Specifically, the 3C structure is epitaxially grown or a large amount of n-type dopant (such as nitrogen, phosphorus or the like) is implanted to form an amorphous portion and the amorphous portion is re-crystallized in the heating process of 1000 to 1300° C. to form 3C—SiC. A method for making contact with the 3C structure is already described and a preferable ohmic contact can be obtained at a low temperature. The 3C—SiC film on the back can be formed by immediately after or at the same time as the 3C—SiC film is formed on the front surface. Alternatively, only the back may be formed in the final step. In an example in which the 3C—SiC film is formed at the same time, a large amount of p-type dopant is ion-implanted into the front surface and a large amount of n-type dopant is ion-implanted into the back surface. Then, the films are re-crystallized at high temperatures to form required 3C—SiC thin films.

A plurality of low-concentration p-type (p$^-$-type) 4H—SiC regions (first 4H—SiC regions) 121 with preset film thickness are formed on portions of the surface region of a stack film formed of the 3C—SiC thin films 111, 112 and portions of the 4H—SiC layer 102 lying under the films. The 4H—SiC regions 121 are selectively formed to extend from the surfaces of the 3C—SiC thin films 111, 112 to the intermediate depth portion of the 4H—SiC layer 102. In each semiconductor element, two 4H—SiC regions 121 are arranged under the 3C—SiC thin film 112 to sandwich the 3C—SiC film 111 and the region of the 4H—SiC layer 102 lying under the film.

High-concentration n-type (n$^+$-type) 4H—SiC regions (second 4H—SiC regions) 122 with preset film thickness are selectively formed on portions of the surfaces of the respective 4H—SiC regions 121 to extend from the surfaces of the respective SiC regions 121 to the intermediate depth portions thereof. Each 4H—SiC region 122 is formed on a region of the 4H—SiC region 121 except the end portion thereof. Then, on part of the surface of each 4H—SiC region 121, a p-type (p$^+$-type) 4H—SiC region (third 4H—SiC region) 123 is formed adjacent to the 4H—SiC region 122. Each 4H—SiC region 123 is formed on the opposite side of the end portion of the 4H—SiC region 121 with respect to the 4H—SiC region 122.

The SiC thin film of the 3C structure is left behind on the surface of each 4H—SiC region 121 other than the surface portion on which the 4H—SiC regions 122, 123 are formed. However, since the above portion is p-doped, the portion may be considered to be changed to the film 112. It is supposed that the above portion is changed to the film 112 for discrimination although a large change does not occur. In the future, a channel is formed directly under the above portion. Further, a 3C thin film portion between the films 112 is expressed by 111.

Thus, the p-type 4H—SiC regions 121 are selectively formed on at least portions of the surface region of the stack film formed of the 3C—SiC thin films 111, 112 and the n-type 4H—SiC layer 102 lying under the films and arranged to be connected to the n-type 4H—SiC region 122 and p-type 4H—SiC region 123. In the example of FIG. 3, a case wherein the adjacent n-type 4H—SiC region 122 and p-type 4H—SiC region 123 are respectively arranged one on the portion of the surface of each p-type 4H—SiC region 121 is shown. When one semiconductor element is formed, two p-type 4H—SiC regions 123 are arranged to sandwich two n-type 4H—SiC regions 122. In other words, in each semiconductor element, the p-type 4H—SiC regions 123 are arranged outside the n-type 4H—SiC regions 122. Further, in the 4H—SiC regions 121, channel regions 124 that are made electrically conductive to the n-type 4H—SiC layer 102 are formed inside the n-type 4H—SiC regions 122.

An insulating film 130 is formed to extend over portions of the surfaces of the two n-type 4H—SiC regions 122. The insulating film 130 acts as a second gate insulating film and is formed of an $SiO_2$ oxide film, for example. The gate insulating film 130 is formed in contact with the surfaces of the n-type 4H—SiC regions 122 on both sides thereof, the surfaces of the 3C—SiC thin films 112 on the SiC regions 121 on which the SiC regions 122 and p-type SiC regions 123 are not formed and the surface of the 3C—SiC thin film 111 on the SiC layer 102 between the two SiC regions 121.

A gate electrode 140 is formed on the gate insulating film 130. Thus, the gate electrode 140 is formed to extend over portions of the n-type 4H—SiC regions 122 on both sides thereof, portions of the 3C—SiC thin films 112 on the SiC regions 121 on which the n-type 4H—SiC regions 122 and p-type 4H—SiC regions 123 are not formed and the 3C—SiC thin film 111 on the SiC layer 102 between the two SiC regions 121 with the gate insulating film 130 disposed therebetween.

Further, electrodes (first conduction electrodes) 150 are formed on different portions of the surfaces of the n-type 4H—SiC regions 122 and the surfaces of the p-type 4H—SiC regions 123. The electrode 150 acts as a source electrode. The source electrode 150 is formed of Ni or the like, can be formed at a low temperature of approximately 550° C. and formed in ohmic contact with the p-type 4H—SiC region 123. The SiC region 123 is used as a substrate contact region in a MOS device. At the same time, the source electrode 150 is formed in ohmic contact with the n-type 4H—SiC region 122. The SiC region 122 is used as a source region in the MOS device.

In the first embodiment, since the $SiO_2$ film is formed, C defects occur in the 3C—SiC thin films 111, 112. C defects occur in the hardening process after the CVD film formation process. The C defect production mechanism is already described. Since C defects can be stabilized by compensating for p-type dopant, the C defect production process is automatically stopped when the whole portions of the thin films 111, 112 are completely compensated for. Since the 4H—SiC region 122 is of an n type, no problem occurs because the n type becomes stronger even if C defects occur in the above region.

Figure 4:
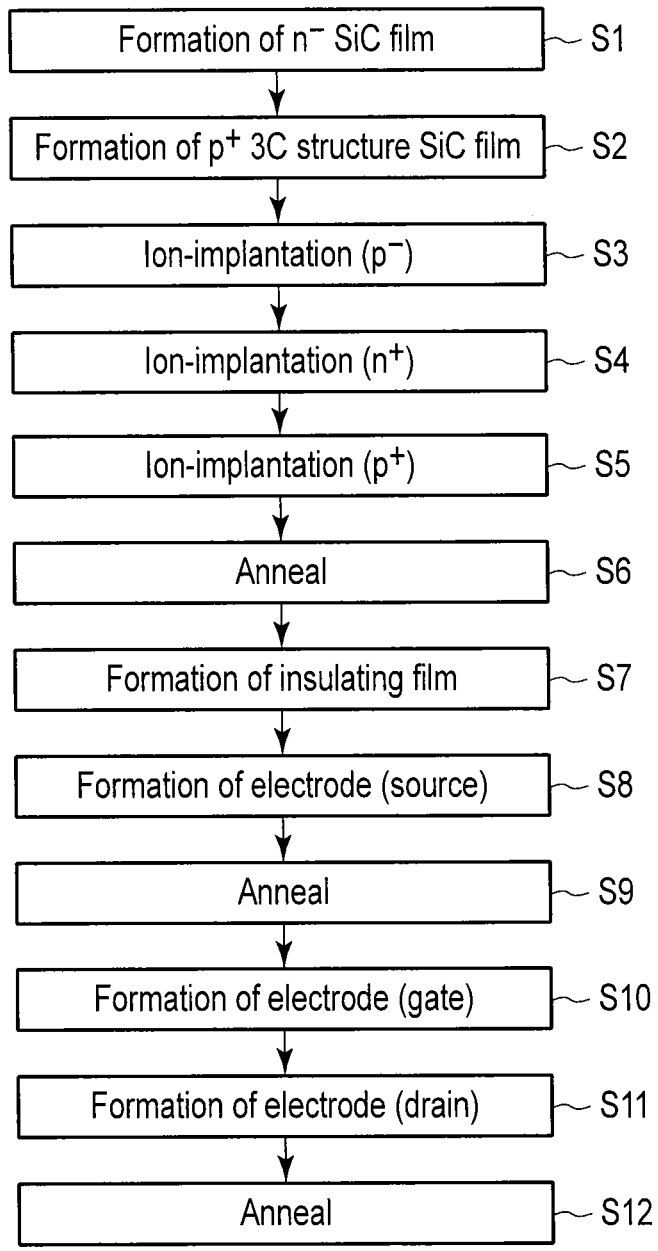
FIG. 4 is a flowchart for illustrating the manufacturing process of the DiMOSFET according to the first embodiment.

The manufacturing process of the SiC semiconductor device of this embodiment based on the above idea is shown in the flowchart of FIG. 4. As shown in FIG. 4, in this embodiment, a series of steps including an n⁻-type 4H—SiC film formation step (S1), a p⁺ type 3C—SiC film formation step (S2), an ion-implantation step (S3) for conversion to a p⁻ type, an ion-implantation step (S4) for conversion to an n+ type, an ion-implantation step (S5) for conversion to a p⁺ type, annealing step (S6), insulating film formation step (S7), source electrode formation step (S8), annealing step (S9), gate electrode formation step (S10), drain electrode formation step (S11) and annealing step (S12) is performed.

Process cross-sectional views showing steps performed according to the flowchart of the manufacturing method of the SiC semiconductor device of the first embodiment are shown in FIGS. 5A to 5G.

In FIGS. 5A to 5D, a process from the n⁻-type SiC film formation step (S1) to the ion-implantation step (S5) of FIG. 4 is shown. The process after the above steps is explained latter.

First, as shown in FIG. 5A, as the n⁻-type 4H—SiC film formation step (S1), an n⁻-type 4H—SiC layer 102 is formed on the surface of an n⁺-type 4H—SiC substrate 100. As the SiC substrate 100, for example, a solid-state single crystalline SiC substrate is used. It is preferable to set the impurity concentration (doping concentration) of the SiC substrate 100 to $1 \times 10^{16}$ atoms/cm³ or more and less than $1 \times 10^{20}$ atoms/cm³. In this case, for example, the substrate is formed with the concentration of $6 \times 10^{17}$ atoms/cm³. In the following embodiments, a substrate with the substrate concentration of $6 \times 10^{17}$ atoms/cm³ as the substrate concentration is used irrespective of a p type or n type when not particularly pointed out. It is preferable to use a hexagonal-system SiC substrate (4H—SiC substrate) of a (0001) plane as the SiC substrate 100.

The SiC layer 102 is formed by growing an n⁻-type 4H—SiC film on the surface of the SiC substrate 100 by means of an epitaxial vapor deposition method. At the time of formation of the epitaxial layer, for example, $SiH_4$ gas and $C_3H_8$ gas can be used as material gas. Further, as impurity (dopant), nitrogen (N) or phosphorus (P) may be used. The SiC layer 102 is used as a withstand voltage holding layer. The film thickness of the SiC layer 102 is preferably set in the range of 0.5 to 20 μm. In this example, the film thickness is set to 10 μm, for example. Further, it is preferable to set the impurity concentration (doping concentration) of the n-type 4H—SiC layer 102 to $8 \times 10^{14}$ atoms/cm³ or more and less than $3 \times 10^{17}$ atoms/cm³. In this case, for example, the layer formed with the concentration of, for example, $5 \times 10^{15}$ atoms/cm³ is used. In the following embodiments, the concentration of $5 \times 10^{15}$ atoms/cm³ is used as the concentration of SiC when not particularly pointed out.

Next, as the p+ type 3C—SiC film formation step (S2), a p⁺ type 3C—SiC thin film 110 is formed on the surface of the SiC layer 102. The basic target values described before are used for the formation method, thickness (approximately 3.5 nm), concentration (approximately $4 \times 10^{19}$ atoms/cm³) and the like. However, in this example, the initial thickness is set to 4 nm and the thickness of approximately 3.5 nm is obtained in the final structure.

Next, as shown in FIG. 5B, the ion-implantation step (S3) for conversion to a p⁻ type is performed. That is, an oxide film (not shown) formed by means of a photolithography and etching process is used as a mask and impurity of a p conductivity type is selectively doped into the surface region of the SiC layer 102. As a result, p⁻-type 4H—SiC regions 121 are formed.

The concentration of the conductive impurity in the p-type 4H—SiC region 121 can be set to $1\times10^{16}/cm^3$, for example. In the following embodiments, the concentration of $1\times10^{16}$ atoms/cm$^3$ is used as the concentration of p$^-$-type 4H—SiC when not particularly pointed out. As the condition of implantation of Al ions used as p-type impurity, for example, the condition of $1\times10^{15}/cm^2$ and 80 keV can be used. In this case, for example, the substrate is heated to 300° C. The concentration of the conductive impurity in the p-type 4H—SiC region 121 is preferably set in the range of $1\times10^{13}$ to $5\times10^{17}/cm^3$. More preferably, the concentration may be set in the range of $1\times10^{15}$ to $5\times10^{16}/cm^3$.

Next, as shown in FIG. 5C, the ion-implantation step (S4) for conversion to an n$^+$ type is performed. That is, n-type conductive impurity is selectively doped into portions of the surfaces of the p-type 4H—SiC regions 121 to form n$^+$-type 4H—SiC regions 122. Specifically, after the mask of the oxide film used for formation of the SiC regions 121 is removed, a mask (not shown) of an oxide film having a new pattern is formed again by means of a photolithography and etching process. Then, n-type conductive impurity is doped via the openings of the new mask to form n$^+$-type 4H—SiC regions 122.

The concentration of the conductive impurity in the n-type SiC region 122 can be set to $2\times10^{20}/cm^3$, for example. In the following embodiments, the concentration of $2\times10^{20}$ atoms/cm$^3$ is used as the concentration of n$^+$-type SiC when not particularly pointed out. As the condition of implantation of N ions used as n-type impurity, for example, the condition of $1\times10^{15}/cm^2$ and 40 keV can be set. In this case, for example, the substrate is heated to 300° C. The concentration of the conductive impurity in the n-type 4H—SiC region 122 is preferably set in the range of $1\times10^{14}$ to $5\times10^{20}/cm^3$. More preferably, the concentration may be set in the range of $5\times10^{15}$ to $3\times10^{20}/cm^3$.

Next, as shown in FIG. 5D, the ion-implantation step (S5) for conversion to a p$^+$ type is performed. That is, p-type conductive impurity is selectively doped into different portions of the surfaces of the p-type 4H—SiC regions 121 to form p$^+$-type 4H—SiC regions 123 adjacent to the n-type 4H—SiC regions 122. Specifically, after the mask of the oxide film used for formation of the SiC regions 122 is removed, a mask (not shown) of an oxide film having a new pattern is formed again by means of a photolithography and etching process. Then, p-type conductive impurity is doped via the openings of the new mask to form p$^+$-type 4H—SiC regions 123.

The concentration of the conductive impurity in the p-type 4H—SiC region 123 can be set to $2\times10^{20}/cm^2$, for example. As the condition of implantation of Al ions used as p-type impurity, for example, the condition of $1\times10^{15}/cm^2$ and 40 keV can be set. In this case, for example, the substrate is heated to 300° C. The concentration of the conductive impurity in the p-type 4H—SiC region 123 is preferably set in the range of $1\times10^{14}/cm^2$ to $5\times10^{20}/cm^2$. More preferably, the concentration may be set in the range of $5\times10^{15}/cm^2$ to $3\times10^{20}/cm^2$.

Next, as the annealing step (S6), an activation annealing process is performed after the implantation step described above. As the activation annealing process, the condition of heating temperature 1600° C. and heating time 30 minutes can be used while using argon (Ar) gas as atmospheric gas, for example. Thus, the structure shown in FIG. 5D can be obtained. At this time, activation of dopant introduced in SiC can be realized, but almost no diffusion occurs.

Figure 5E:
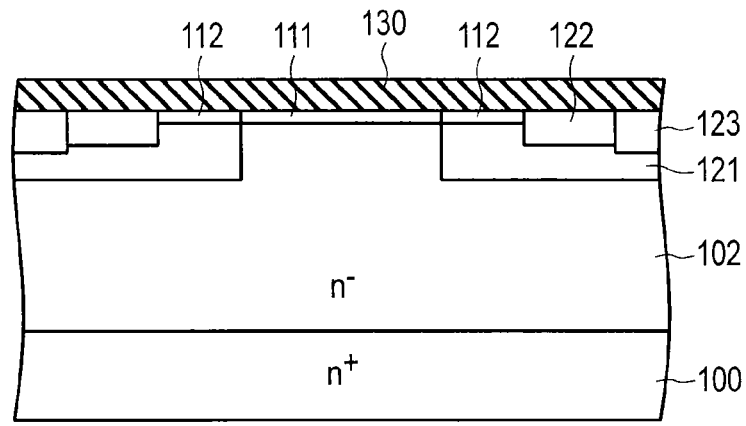
Figure 5F:
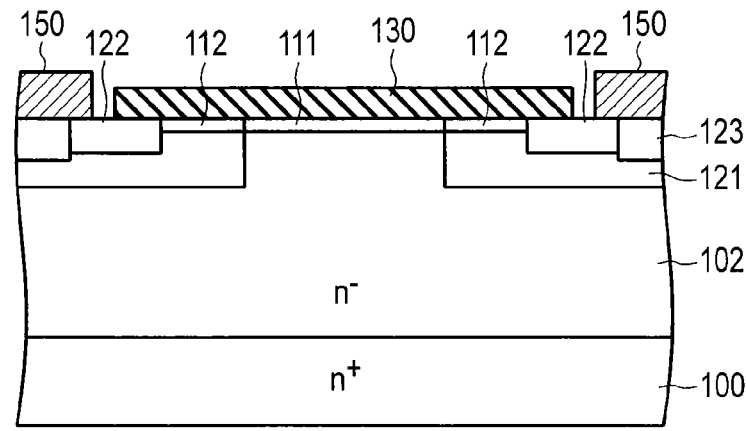
Figure 5G:
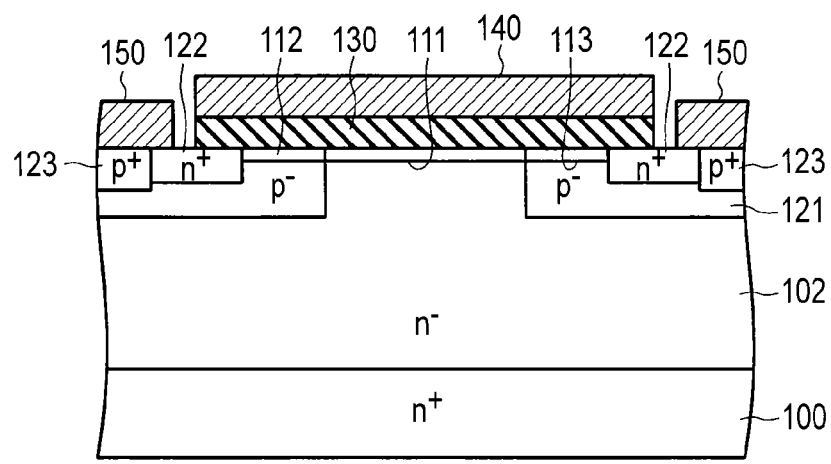

In FIGS. 5E to 5G, the process from the insulating film formation step (S7) to the gate electrode formation step (S10) of FIG. 4 is shown.

As shown in FIG. 5E, as the insulating film formation step (S7), an oxide film 130 is formed to cover the entire surfaces of the 3C—SiC thin film 111 on the n-type 4H—SiC layer 102, the 3C—SiC thin film 112 on the p-type 4H—SiC region 121, the n-type 4H—SiC region 122 and the p-type 4H—SiC region 123. As the method for formation of the oxide film 130, for example, a dry oxidation (thermal oxidation) method may be used. For example, a fine oxide film can be formed by means of the dry oxidation method in the condition of 1200° C. and heating time 30 minutes, for example.

Here, the above-mentioned 3C—SiC layers 111,112 becomes an insulating film simultaneously with the forming of the above-mentioned oxide film 130.

Next, as shown in FIG. 5F, a resist film (not shown) having a pattern is formed on the oxide film 130 by means of a photolithography method. Portions of the oxide film 130 that lie on the surfaces of the p-type 4H—SiC regions 123 and portions of the surfaces of the n-type 4H—SiC regions 122 are removed by etching with the resist film used as a mask. As a result, the insulating film 130 that extends over the two n-type 4H—SiC regions 122 on both sides thereof is formed.

Subsequently, as the source electrode formation step (S8), conductive films such as metal films or the like are formed on the surfaces of the p-type 4H—SiC regions 123 and portions of the surfaces of the n-type 4H—SiC regions 122 that are exposed by the use of the resist film and openings formed by removing the oxide film 130 and forming opening portions. The conductive films are used as source electrodes 150. After this, the conductive films left behind on the resist film are removed (lift off) by removing the resist film. Further, spaces can be formed to prevent the oxide film 130 and source electrodes 150 from contacting each other by narrowing the width of the oxide film 130 by etching back or the like. At this time, as the conductor used as the source electrode 150, for example, nickel (Ni) is preferably used.

[Source Electrode Formation at Low Temperature]

As the annealing step (S9), the heat treatment at a low temperature of 550° C. can be performed after the source electrodes 150 are formed. In this case, for example, the heating time is set to five minutes in argon (Ar) gas. By the above heat treatment, Ni$_2$Si electrodes 150 are formed. Since the surface portion of the n-type SiC region 122 is formed with a 3C structure by formation of the 3C—SiC thin film 110 shown in FIG. 5A, the electron barrier is removed and an electrode structure with low contact resistance can be obtained. At the same time, since a large amount of Al is introduced, a contact of low contact resistance can easily be formed for the p-type contact.

As shown in FIG. 5G, as the gate electrode formation step (S10), an electrode 140 used as a gate electrode is formed on the oxide film 130 used as a gate insulating film. For example, the electrode may be formed of n-type polysilicon. Further, the source electrode 150 may also be formed of n-type polysilicon and salicide films of NiSi, Ni$_2$Si or the like formed by forming Ni films on the polysilicon films and then subjecting the same to the heat treatment may be used for both of the source electrode 150 and gate electrode 140.

[Back Electrode]

Next, as the drain electrode formation step (S11), the structure shown in FIG. 3 is obtained by forming an electrode 160 used as a drain electrode on the back surface of the SiC substrate 100. In this case, if the conventional electrode structure, for example, Ni electrode is used for the back electrode, a high-temperature process of 800° C. or more is required. In the method of this embodiment, since no problem occurs even if the SiO$_2$/SiC interface becomes rough, a high-temperature process of 1050° C. is permitted. For example, the heating time is set to five minutes in argon (Ar) gas. By the above heat treatment, Ni$_2$Si is formed on the interface to make an ohmic connection.

In the conventional process, a temperature of 800° C. or more cannot be applied. This is because the SiC substrate/SiO$_2$ interface becomes rough. However, in this embodiment, since the channel is buried inside the SiC substrate, no problem occurs at all even if the interface (the interface between 3C—SiC and SiO$_2$) becomes rough. Therefore, the high-temperature process of 1050° C. can be performed. Thus, it is one of the important effects of this embodiment that the process temperature can be set high. This is not only useful when the back electrode is formed but also effective when it is desired to perform another process at a higher temperature. For example, only the MOS interface is formed with the 3C structure and a buried channel is formed. Then, in the case of a process of removing 3C—SiC from the other region such as the source region, it is extremely effective that a source electrode can be formed at 1050° C.

As another method, a large number of N atoms are ion-implanted into the back surface and, as a result, the back surface may be formed with a 3C structure and a contact with low contact resistance may be obtained. In this case, if the 3C structure is previously formed by the epi-process, the heat treatment of 550° C. can be performed as the annealing step (S12). For example, the heating time is set to five minutes in argon (Ar) gas. By the heat treatment, Ni$_2$Si is formed on the interface to make an ohmic connection. Alternatively, in the case of re-crystallization by the impla-process, a process of approximately 1050° C. is required to form the structure. Since no problem occurs even if the interface between 3C—SiC and SiO$_2$ becomes rough, the high-temperature process of 1050° C. can be performed.

As the SiC substrate 100, for example, a 4H—SiC substrate having another plane such as a (000-1) plane as a main surface may be used. That is, this is because the method for growing the 3C structure thin film of this embodiment on the surface is effective irrespective of the substrate azimuth.

[Effect of Buried Channel]

In the first embodiment, the buried channel is formed in a position separated from SiO$_2$ by the thickness of the 3C—SiC thin film 112. Then, the mobility is sufficiently high over an entire region of application voltage and the peak is set to approximately 300 cm$^2$/Vs.

Since the channel is formed in a portion several nm inside from the interface between SiO$_2$ and SiC, scattering due to small roughness on the interface can be neglected. The interface becomes slightly rough in the SiO$_2$ film formation process by means of the thermal oxidation method or the like, but care therefore is unnecessary.

Further, it is normally required to improve the insulating film and SiO$_2$/SiC substrate interface by subjecting the SiO$_2$ film to a nitriding process. However, in this embodiment, the complicated process is not required at all. That is, this is because the mobility is not greatly influenced since charge traps in the SiO$_2$ film and SiO$_2$/SiC substrate interface are sufficiently separated from the actual channel. In this respect, the effect that the insulating film formation process can be simplified is extremely significant. In practice, simplification of the process greatly influences not only cost but also final yield and device operation rate.

Since the 3C—SiC thin film 112 acts as part of the high-dielectric-constant gate insulating film, an induced charge becomes sufficiently large and a current can be made sufficiently large. In the buried channel formed by the conventional counter doping method, there is a problem that a sufficiently large current cannot be obtained at a voltage other than the specified application voltage even if the peak position of the mobility is high. However, in this embodiment, such a problem does not occur.

[Electrode]

In the connecting portion between the electrode and the 3C—SiC thin film, the 3C—SiC thin film reacts with a metal to make a contact of contact resistance lower than that of the 4H—SiC layer for both of the n type and p type. The first reason is that the band gap becomes small. Therefore, the barrier between the metal and the interface becomes low. The second reason is that dopant lying in the metal and the reaction region is concentrated on the interface on the substrate side. Therefore, the thickness of the barrier of the interface becomes small. As a result, the contact resistance can be lowered.

Thus, (1) the on resistance of the source electrode/n$^+$-type region interface can be extremely lowered in comparison with the conventional case. The target value of the contact resistance is set to $1\times10^{-5}$ Ωcm$^2$ or less, but $1\times10^{-7}$ Ωcm$^2$ can be realized.

(2) It is understood that the contact resistance of the source electrode/p$^+$-type region interface can be extremely lowered in comparison with the conventional case. The target value of the contact resistance is set to $1\times10^{-3}$ Ωcm$^2$ or less, but $1\times10^{-6}$ Ωcm$^2$ can be realized.

(3) With the conventional configuration, an interface reaction layer is formed at a high temperature between the source electrode and the n$^+$-type and p$^+$-type regions to make contacts. It is known that the mobility is markedly lowered since a large number of dangling bonds of the SiO$_2$/SiC substrate interface occur as a result of performing the high-temperature heating process after a gate insulating film is formed. However, in the source electrode formation process of this embodiment, only a low-temperature annealing process is performed for the purpose of forming interface silicide at a low temperature. As a result, it is understood that the channel mobility can be set to a value (peak value approximately 300 cm$^2$/Vs after the process of this embodiment is performed) larger by one digit or more than that of the conventional case (peak value 20 cm$^2$/Vs after the high-temperature heating process is performed without using the 3C structure). Since an increase in the mobility directly influences the on resistance, it is extremely effective in enhancing the device characteristics.

As described above, if 3C—SiC is introduced into the metal/SiC interface, both of the source electrode and the drain electrode can be ohmic-connected. Therefore, a low-resistance contact between the p-type 4H—SiC region 123 and the metal can be realized. Further, a low-resistance contact between the n-type 4H—SiC region 122 and the metal can also be realized. Additionally, one electrode can be connected to the p-type 4H—SiC region 123 and the n-type 4H—SiC region 122 at the same time.

Thus, in this embodiment, the cause of lowering the mobility in the SiC/SiO$_2$ interface can be eliminated by forming the 3C—SiC thin film 112 insulated by introducing C defects and p-type dopant in the interface between the p-type 4H—SiC region 121 and the gate insulating film 130 and, as a result, the original high mobility and high withstand voltage of 4H—SiC can be realized. This is an extremely significant effect for a DiMOSFET that is a power device. Further, since the contact resistances between the source electrode 150 and the n-type 4H—SiC region 122 and p-type 4H—SiC region 123 are reduced by formation of the 3C—SiC thin film 110, the element characteristic can also be enhanced.

Second Embodiment

FIG. 6 is a cross-sectional view showing the element structure of an SiC semiconductor device according to a second embodiment and particularly shows a case where the embodiment is applied to an insulated gate bipolar transistor (IGBT). The same symbols are attached to the same portions as those of FIG. 3 and the detailed explanation thereof is omitted.

This embodiment is different from the first embodiment described before in that a p$^+$-type 4H—SiC substrate 200 is used instead of the n$^+$-type 4H—SiC substrate 100 and a stack structure of an n$^+$-type 4H—SiC layer 201 and n$^-$-type 4H—SiC layer 202 is used instead of the n$^-$-type 4H—SiC layer 102. In other words, the high-concentration n$^+$-type 4H—SiC layer 201 is formed on the surface of the high-concentration p$^+$-type 4H—SiC substrate 200 and then the low-concentration n$^-$-type 4H—SiC layer 202 is formed on the structure. The SiC layers 201, 202 are used as withstand voltage holding layers.

Further, 4H—SiC regions 121, 122, 123 and 3C—SiC thin films 111, 112 that are the same as those of the first embodiment are formed on the surface portion of the SiC layer 202 and electrodes 140, 250, 260 are further formed.

[Back Contact of IGBT]

The electrode 260 of a conductive material is formed on the back of the SiC substrate 200. The electrode 260 is used as a collector electrode (second conduction electrode). In this embodiment, a Ti/Al stack film is used. For example, an ohmic connection can be obtained by performing an annealing process for two minutes at 1050° C. in Ar gas. In this embodiment, since the buried channel structure is used, the high-temperature annealing process can be performed.

[Modification of Back Contact]

As the modification of the back electrode formation process, it is effective to form 3C—SiC by ion-implanting ions such as Al into the back of the SiC substrate 200. At this time, the electrode 260 is ohmic-connected to the back of the SiC substrate 200 as described before.

Further, the electrode 250 is used as an emitter electrode in the second embodiment. The electrode 250 is ohmic-connected to the n-type 4H—SiC region 122 and p-type 4H—SiC region 123 as described before in the former embodiment.

The manufacturing method is substantially the same as that of the first embodiment except that the n-type 4H—SiC layers 201, 202 are formed on the p-type 4H—SiC substrate 200 and the process of forming the 3C—SiC thin films 111, 112 on the channel region is substantially the same as that of the first embodiment.

With the above structure, the buried channel that is separated from SiO$_2$ by the thickness of the 3C—SiC thin film is formed by forming the gate insulating film 112 formed of the 3C—SiC thin film by introduction of p-type dopant and introduction of C defects. Therefore, the mobility can be made sufficiently high over an entire region of application voltage and the peak can be set to approximately 300 cm$^2$/Vs. In this respect, this embodiment is the same as the first embodiment.

Further, in the connecting portion between the electrode and the 3C—SiC thin film, the 3C—SiC thin film reacts with the metal to form a contact of contact resistance lower than that of the 4H—SiC layer for both of the n type and p type. In this respect, this embodiment is the same as the first embodiment. Further, since the high-temperature annealing can be performed in the back electrode formation process or the like, a contact of low contact resistance can be formed. In this respect, this embodiment is the same as the first embodiment.

As described above, in the second embodiment, a high performance IGBT can be obtained. In this case, since the bipolar operation is performed, the conduction modulation occurs and the on resistance becomes small. As a result, the conduction ability can be markedly enhanced in comparison with that of the DiMOSFET of the first embodiment. At this time, since not only an electron current but also a hole current flows, it is more important to lower the contact resistance between the emitter electrode and the p$^+$-type region in comparison with the case of the first embodiment. In the second embodiment, since sufficiently low contact resistance can be obtained, the technique of the second embodiment becomes extremely effective in the IGBT element formation method accompanied by a later miniaturization process.

(Modification)

This invention is not limited to the above embodiments described above.

In the embodiments, an example in which this invention is applied to the DiMOSFET or IGBT is explained, but this invention can be applied to a structure having a p-type 4H—SiC region formed on the surface portion of an SiC substrate and a gate electrode formed on the 4H—SiC region with a gate insulating film disposed therebetween.

For example, this invention can be applied to a trench type vertical MOSFET as shown in FIG. 7 and FIG. 8. The device is formed by sequentially forming a first SiC region 121 of a p$^-$ type and a second SiC region 122 of an n$^+$ type on a 4H—SiC layer 102 by epitaxial growth and then forming third SiC regions 123 of a p$^+$ type by implanting. Next, portions of the second SiC region 122 are dug to the 4H—SiC layer 102 to form grooves and expose the side surfaces of the first SiC region 121. Then, after gate insulating films 130 are formed on the side surfaces of each groove, a gate electrode 140 is filled in each groove to form the device. In the case of this example, the same effect as those of the first and second embodiments can be expected by forming the 3C—SiC thin film 112 insulated by introduction of C defects and p-type dopant in the side surfaces of the SiC region 121 that are exposed to the groove before formation of the gate insulating films 130.

Further, when a 3C—SiC thin film is formed on the 4H—SiC layer by means of an impla-process, a high-temperature heating process after the impla-process may be omitted and the amorphous structure or polycrystalline structure may be left behind. Since the portion of the 3C—SiC thin film does not act as a channel and is used as a gate insulating film, no problem occurs even if the amorphous structure or polycrystalline structure are left behind. In this case, since the 3C—SiC thin film can be formed by implanting and the high-temperature process can be omitted, the cost merit becomes extremely great.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An SiC semiconductor device comprising:
a 4H—SiC substrate,
a p-type 4H—SiC region formed on at least part of a surface portion of the 4H—SiC substrate,
a first gate insulating film formed on the 4H—SiC region, the first gate insulating film being a 3C—SiC thin film having p-type dopant introduced therein,
a second gate insulating film of an oxide film formed on the first gate insulating film, and
a gate electrode formed on the second gate insulating film.

2. The device of claim 1, wherein the first gate insulating film is insulated by introducing C defects in the 3C—SiC thin film.

3. The device of claim 1, wherein the first gate insulating film has one of an amorphous structure and polycrystalline structure.

4. The device of claim 3, wherein thickness of the first gate insulating film is set in a range of 2 to 5 nm and an amount of p-type dopant contained in the first gate insulating film is set in a range of $1\times10^{18}$ to $1\times10^{21}$ $cm^3$.

5. The device of claim 1, wherein the SiC substrate is an n-type 4H—SiC substrate.

6. The device of claim 5, wherein the SiC substrate has a stack structure of p-type 4H—SiC and n-type 4H—SiC.

7. An SiC semiconductor device comprising:
a 4H—SiC substrate,
a first 4H—SiC region of a p type formed on part of a surface portion of the 4H—SiC substrate,
a second 4H—SiC region of an n type formed on part of a surface portion of the first 4H—SiC region, the second 4H—SiC region being formed separately from one end portion of the first 4H—SiC region,
a third 4H—SiC region of the p type formed on part of the surface portion of the first 4H—SiC region, the third 4H—SiC region being formed with impurity concentration higher than that of the first 4H—SiC region and formed on the opposite side of the end portion with respect to the second 4H—SiC region,
a first gate insulating film formed on part of the surface portion of the first 4H—SiC region, the first gate insulating film being a 3C—SiC thin film having p-type dopant introduced therein and being formed closer to the end portion side than to the second 4H—SiC region,
a second gate insulating film of an oxide film formed on the first gate insulating film,
a gate electrode formed on the second gate insulating film,
a first conduction electrode formed to extend over the second 4H—SiC region and third 4H—SiC region, and
a second conduction electrode formed on a back side of the substrate.

8. The device of claim 7, wherein an n-type 3C—SiC thin film is formed on an interface portion between the first conduction electrode and the second 4H—SiC region and a p-type 3C—SiC thin film is formed on an interface portion between the first conduction electrode and the third 4H—SiC region.

9. The device of claim 7, wherein the first gate insulating film is insulated by introducing C defects in the 3C—SiC thin film.

10. The device of claim 7, wherein the first gate insulating film has one of an amorphous structure and polycrystalline structure.

11. The device of claim 7, wherein thickness of the first gate insulating film is set in a range of 2 to 5 nm and an amount of p-type dopant contained in the first gate insulating film is set in a range of $1\times10^{18}$ to $1\times10^{21}$ $cm^3$.

12. The device of claim 7, wherein the SiC substrate is an n-type 4H—SiC substrate.

13. The device of claim 7, wherein the SiC substrate has a stack structure of p-type 4H—SiC and n-type 4H—SiC.

14. An SiC semiconductor device manufacturing method comprising:
forming a p-type 3C—SiC thin film used as a first gate insulating film on at least a region of a surface portion of a 4H—SiC substrate that is to be used as a channel,
forming a p-type 4H—SiC region on a region of the surface portion of the 4H—SiC substrate that includes the 3C—SiC thin film,
forming a second gate insulating film on the 3C—SiC thin film and simultaneously insulating the 3C—SiC thin film by introducing C defects in the 3C—SiC thin film to transform the first gate insulating film, and
forming a gate electrode on the second gate insulating film.

15. The method of claim 14, wherein the forming the first gate insulating film is epitaxially growing a p-type 3C—SiC thin film on the surface of the SiC substrate.

16. The method of claim 14, wherein the forming the first gate insulating film is forming the surface portion of the SiC substrate into an amorphous form by ion-implanting p-type impurity and then thermally processing the amorphous-form portion.

* * * * *